(12) United States Patent
Tomita et al.

(10) Patent No.: US 10,002,863 B2
(45) Date of Patent: Jun. 19, 2018

(54) SEMICONDUCTOR DEVICE AND MANUFACTURING METHOD FOR THE SAME

(71) Applicant: TOYOTA JIDOSHA KABUSHIKI KAISHA, Toyota-shi, Aichi-ken (JP)

(72) Inventors: Hidemoto Tomita, Toyota (JP); Yoshitaka Nagasato, Toyota (JP); Takashi Okawa, Nisshin (JP); Masakazu Kanechika, Nagakute (JP); Hiroyuki Ueda, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days. days.

(21) Appl. No.: 15/145,236

(22) Filed: May 3, 2016

(65) Prior Publication Data

US 2016/0343702 A1 Nov. 24, 2016

(30) Foreign Application Priority Data

May 21, 2015 (JP) .................................. 2015-103942

(51) Int. Cl.
*H01L 27/06* (2006.01)
*H01L 29/205* (2006.01)
(Continued)

(52) U.S. Cl.
CPC ............ *H01L 27/0629* (2013.01); *G01K 7/01* (2013.01); *G01K 7/16* (2013.01); *H01L 21/30612* (2013.01); *H01L 21/8252* (2013.01); *H01L 23/34* (2013.01); *H01L 27/0605* (2013.01); *H01L 29/205* (2013.01); *H01L 29/66462* (2013.01); *H01L 29/7786* (2013.01); *H01L 29/872* (2013.01); *H01L 21/762* (2013.01);
(Continued)

(58) Field of Classification Search
CPC ............ H01L 27/0629; H01L 29/7786; H01L 29/872; H01L 21/30612; H01L 29/66462; H01L 29/205; H01L 21/8252; H01L 27/0605; H01L 23/34; H01L 29/1066; H01L 21/762; H01L 29/2003; G01K 7/01; G01K 7/16
See application file for complete search history.

(56) References Cited

U.S. PATENT DOCUMENTS 5,821,599 A 10/1998 Rupp
2010/0226409 A1 9/2010 Sandhu et al.
(Continued)

FOREIGN PATENT DOCUMENTS

JP H03-34360 A 2/1991
JP H08-506665 A 7/1996
(Continued)

*Primary Examiner* — Latanya N Crawford
(74) *Attorney, Agent, or Firm* — Oliff PLC

(57) ABSTRACT

A semiconductor device is capable of accurately sensing a temperature of a semiconductor element incorporated in a semiconductor substrate. The semiconductor device includes a temperature sensor. The temperature sensor includes a first nitride semiconductor layer of p-type, a first sense electrode, and a second sense electrode. The first sense electrode and the second sense electrode are located to be capable of passing an electric current between the first sense electrode and the second sense electrode through the first nitride semiconductor layer.

9 Claims, 4 Drawing Sheets

(51) Int. Cl.
*H01L 29/872* (2006.01)
*H01L 21/306* (2006.01)
*H01L 29/66* (2006.01)
*H01L 23/34* (2006.01)
*H01L 21/8252* (2006.01)
*G01K 7/16* (2006.01)
*H01L 29/778* (2006.01)
*G01K 7/01* (2006.01)
*H01L 29/20* (2006.01)
*H01L 21/762* (2006.01)
*H01L 29/10* (2006.01)

(52) U.S. Cl.
CPC ...... *H01L 29/1066* (2013.01); *H01L 29/2003* (2013.01)

(56) References Cited

U.S. PATENT DOCUMENTS

| | | | |
|---|---|---|---|
| 2011/0088456 A1* | 4/2011 | Ren | G01N 33/005 73/31.06 |
| 2011/0163349 A1 | 7/2011 | Sakai et al. | |
| 2011/0233615 A1 | 9/2011 | Machida | |
| 2013/0168737 A1* | 7/2013 | Prechtl | H01L 21/8258 257/194 |
| 2014/0070319 A1 | 3/2014 | Tonomura et al. | |
| 2016/0035719 A1* | 2/2016 | Kanechika | H01L 29/66462 257/195 |
| 2016/0290873 A1* | 10/2016 | Horng | G01R 31/2874 |

FOREIGN PATENT DOCUMENTS

| | | |
|---|---|---|
| JP | H10-50993 A | 2/1998 |
| JP | 2004-311913 A | 11/2004 |
| JP | 2009-524798 A | 7/2009 |
| JP | 2011-205029 A | 10/2011 |
| JP | 2012-244087 A | 12/2012 |
| JP | 2014-053554 A | 3/2014 |
| JP | 2014-099535 A | 5/2014 |
| JP | 2016-032011 A | 3/2016 |
| WO | 2010/032423 A1 | 3/2010 |

* cited by examiner

SEMICONDUCTOR DEVICE AND MANUFACTURING METHOD FOR THE SAME

CROSS-REFERENCE TO RELATED APPLICATION

This application claims priority to Japanese Patent Application No. 2015-103942 filed on May 21, 2015, the entire contents of which are hereby incorporated by reference into the present application.

TECHNICAL FIELD

The technology disclosed herein relates to a semiconductor device and a manufacturing method for the same.

BACKGROUND

JP 2014-99535 A discloses a semiconductor device having a HEMT (High Electron Mobility Transistor) and a temperature sensor. In this semiconductor device, a semiconductor substrate (nitride semiconductor substrate) in which the HEMT is formed and a semiconductor substrate (silicon substrate) in which the temperature sensor is formed are connected to a common lead frame. Since a strong current flows in the HEMT, the HEMT generates heat during operation. Since this semiconductor device has a temperature sensor, the HEMT can be controlled according to the temperature detected by the temperature sensor.

SUMMARY

In the semiconductor device in. JP 2014-99535 A, a temperature sensor is provided in a silicon substrate (i.e., an IC chip for control). Meanwhile, as in the HEMT described above, a semiconductor element provided in a nitride semiconductor substrate is known. In a case where the temperature of the semiconductor element provided in the nitride semiconductor substrate is detected by the temperature sensor provided in the silicon substrate, the temperature sensor cannot be arranged near the semiconductor element because the semiconductor element and the temperature sensor are provided in separate semiconductor substrates. Accordingly, this results in a problem that the temperature of the semiconductor element cannot accurately be detected by the temperature sensor.

A semiconductor device disclosed herein comprises a temperature sensor. The temperature sensor comprises: a first nitride semiconductor layer of p-type; and a first sense electrode and a second sense electrode located to be capable of passing an electric current between the first sense electrode and the second sense electrode through the first nitride semiconductor layer.

To measure a temperature using the temperature sensor of this semiconductor device, a current is caused to flow between the first sense electrode and the second sense electrode. A current flows between the first and second sense electrodes via the first nitride semiconductor layer. Carrier density in the first nitride semiconductor layer, which is the p-type nitride semiconductor layer, greatly depends on temperature. Due to this, an electrical resistance of the first nitride semiconductor layer changes with temperature. Therefore, current-voltage characteristic between the first and second sense electrodes changes with temperature. Therefore, temperature can be detected by causing current to flow between the first and second sense electrodes. In addition, since this sensor uses the electrical resistance of the first nitride semiconductor layer, the sensor can be provided in a semiconductor substrate composed of the nitride semiconductor layer. Therefore, another semiconductor element (e.g., HEMT) using a nitride semiconductor layer and this temperature sensor can be provided in a common semiconductor substrate. Accordingly, the temperature sensor can be arranged near the semiconductor element and, hence, the temperature of the semiconductor element can be detected accurately.

Furthermore, this disclosure provides a method for manufacturing a semiconductor device. The semiconductor device manufactured by this method comprises a HEMT and a temperature sensor provided in a common semiconductor substrate. The method comprises growing a third nitride semiconductor layer, growing of a p-type nitride semiconductor layer, dividing the p-type nitride semiconductor layer, formation of a gate electrode, formation of source and drain electrodes, and formation of first and second sense electrodes. In the growing of the third nitride semiconductor layer, the third nitride semiconductor layer is grown on a second nitride semiconductor layer. The third nitride semiconductor layer has a bandgap wider than a bandgap of the second nitride semiconductor layer. In the growing of the p-type nitride semiconductor layer, the p-type nitride semiconductor layer is grown on the third nitride semiconductor layer. In the dividing of the p-type nitride semiconductor layer, a part of the p-type nitride semiconductor layer is etched so as to divide the p-type nitride semiconductor layer into the fourth nitride semiconductor layer and the first nitride semiconductor layer. In the formation of the gate electrode, the gate electrode is formed above the fourth nitride semiconductor layer. In the formation of the source and the drain electrodes, the source and the drain electrodes which are electrically connected to the third nitride semiconductor layer is formed so that the fourth nitride semiconductor layer is located in a range between the source electrode and the drain electrode and the first nitride semiconductor layer is located outside the range in a plan view of an upper surface of the third nitride semiconductor layer. In the formation of the first and the second sense electrodes, the first and the second sense electrodes are formed so as to be capable of passing an electric current between the first sense electrode and the second sense electrode through the first nitride semiconductor layer.

In the foregoing manufacturing method, the gate electrode, source electrode, drain electrode, first sense electrode, and second sense electrode may be formed in any order. Alternatively, some of these electrodes may be formed simultaneously.

According to the foregoing manufacturing method, the HEMT and the temperature sensor can be formed in a single semiconductor substrate. Accordingly, the temperature of the HEMT can be detected accurately by the temperature sensor.

DESCRIPTION OF EMBODIMENTS

Embodiment 1

Figure 1:
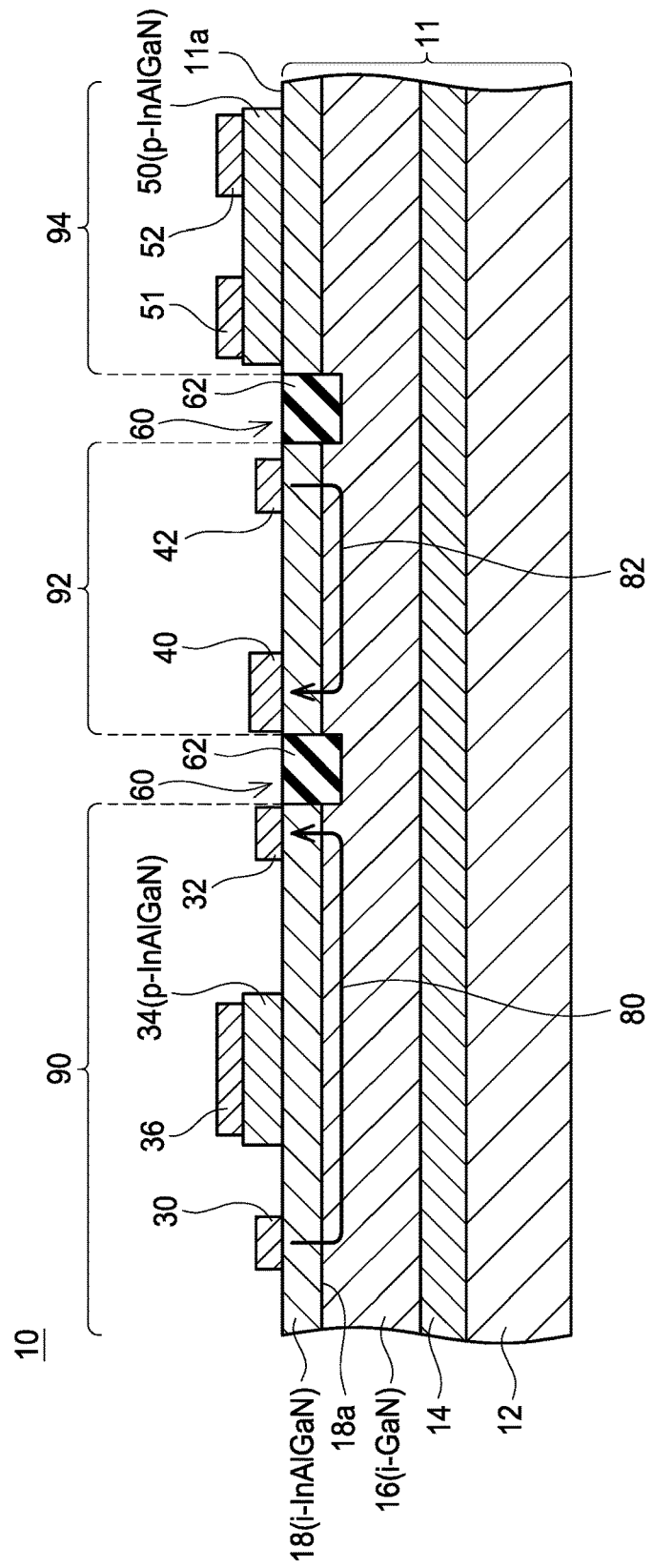
FIG. 1 is a vertical sectional view of a semiconductor device 10.

A semiconductor device 10 according to an embodiment shown in FIG. 1 has a semiconductor substrate 11. In a plan view of a surface 11a of the semiconductor substrate 11, the semiconductor substrate 11 is sectioned into a HEMT region 90, a diode region 92, and a temperature sensor region 94. The diode region 92 is adjacent to the HEMT region 90. The temperature sensor region 94 is adjacent to the diode region 92. Additionally, the semiconductor substrate 11 has a structure in which a ground substrate 12, a buffer layer 14, an electron transit layer 16, and an electron supply layer 18 are arranged in a stack. The ground substrate 12, the buffer layer 14, the electron transit layer 16, and the electron supply layer 18 each extend along a planar direction of the semiconductor substrate 11 (i.e., in a direction orthogonal to a direction of a thickness of the semiconductor substrate 11). Therefore, the HEMT region 90, diode region 92, and temperature sensor region 94 each have a laminated structure in which the ground substrate 12, the buffer layer 14, the electron transit layer 16 and the electron supply layer 18 are arranged in a stack.

The ground substrate 12 is composed of silicon. However, the ground substrate 12 may be composed of any other material (e.g., sapphire, SiC, GaN, or the like) that is able to crystal grow a nitride semiconductor layer on its surface.

The buffer layer 14 is arranged on the ground substrate 12. The buffer layer 14 is composed of GaN. However, the buffer layer 14 may be composed of another material such as AlGaN, AlN, or the like.

The electron transit layer 16 is arranged on the buffer layer 14. The electron transit layer 16 is composed of GaN of i-type (i.e., undoped type).

The electron supply layer 18 is arranged on the electron transit layer 16. The electron supply layer 18 is composed of InAlGaN of i-type. To be more specific, the electron supply layer 18 is composed of $In_{x1}Al_{y1}Ga_{1-x1-y1}N$ ($0 \leq x1 \leq 1$, $0 \leq y1 \leq 1$, $0 \leq 1-x1-y1 \leq 1$). The bandgap of the electron supply layer 18 is wider than that of the electron transit layer 16. A hetero junction interface 18a is provided in the interface between the electron supply layer 18 (i.e., GaN) and the electron transit layer 16 (i.e., InAlGaN). A 2DEG (two-dimensional electron gas) is provided in the electron transit layer 16 near the hetero junction interface 18a.

Trenches 60 are provided in the surface 11a of the semiconductor substrate 11. Each of the trenches 60 extends through the electron supply layer 18 from the surface 11a and reaches the electron transit layer 16. In a plan view of the surface 11a, the trenches 60 extend so as to separate the HEMT region 90, diode region 92, and temperature sensor region 94. The respective electron supply layers 18 in the HEMT region 90, in the diode region 92, and in the temperature sensor region 94 are separated from one another. A separating insulation layer 62 is arranged in each trench 60.

A source electrode 30, a drain electrode 32, a p-type gate layer 34, and a gate electrode 36, are provided in the HEMT region 90.

The source electrode 30 is arranged on the electron supply layer 18. The source electrode 30 is an electrode made of layers of Ti and Al arranged in a stack. Ti is in contact with the electron supply layer 18, and Al is layered on the Ti. The source electrode 30 is in ohmic contact with the electron supply layer 18.

The drain electrode 32 is arranged on the electron supply layer 18. The drain electrode 32 is an electrode made of layers of Ti and Al arranged in a stack. Ti is in contact with the electron supply layer 18, and Al is stacked on the Ti. The drain electrode 32 is in ohmic contact with the electron supply layer 18, The drain electrode 32 is separated from the source electrode 30.

The p-type gate layer 34 is arranged on the electron supply layer 18. The p-type gate layer 34 is in contact with the electron supply layer 18. The p-type gate layer 34 is composed of InAlGaN of p-type. To be more specific, the p-type gate layer 34 is composed of $In_{x2}Al_{y2}Ga_{1-x2-y2}N$ of p-type ($0 \leq x2 \leq 1$, $0 \leq y2 \leq 1$, $0 \leq 1-x2-y2 \leq 1$). Incidentally, in one example, x2=x1 and y2=y1 may be set. in a plan view of the surface 11a of the semiconductor substrate 11 (i.e., of the surface of the electron supply layer 18), the p-type gate layer 34 is disposed in a range between the source electrode 30 and the drain electrode 32.

The gate electrode 36 is arranged on the p-type gate layer 34. The gate electrode 36 is composed of Ni. The gate electrode 36 is in ohmic contact with the p-type gate layer 34. However, by composing the gate electrode 36 of another material, the gate electrode 36 may be in Schottky-contact with the p-type gate layer 34.

In the HEMT region 90, a HEMT of normally-off type is composed of the electron transit layer 16, electron supply layer 18, source electrode 30, drain electrode 32, p-type gate layer 34, gate electrode 36, and so on. When the potential of the gate electrode 36 is lower than a threshold, a depletion layer extends from the p-type gate layer 34 to the electron supply layer 18 located below the p-type gate layer 34. The lower end of the depletion layer reaches as far as the hetero junction interface 18a. Therefore, in this state, 2DEG is not formed in the hetero junction interface 18a immediately below the p-type gate layer 34. The depletion layer separates 2DEG into a source electrode 30 side and a drain electrode 32 side. In this state, a current does not flow even when a voltage is applied between the source electrode 30 and the drain electrode 32. When the potential of the gate electrode 36 is increased to a threshold or above, the depletion layer retreats toward the p-type gate layer 34, and 2DEG is formed on the hetero junction interface 18a immediately below the p-type gate layer 34. That is, 2DEG is formed over the entire hetero junction interface 18a in the HEMT region 90. Therefore, when a voltage is applied between the source electrode 30 and the drain electrode 32, an electron flows from the source electrode 30 to the drain electrode 32 through 2DEG, as shown by the arrow 80 in FIG. 1. That is, the HEMT turns on. When the HEMT turns on, a temperature of the HEMT region 90 increases.

An anode electrode 40 and a cathode electrode 42 are provided in the diode region 92.

The anode electrode 40 is arranged on the electron supply layer 18. The anode electrode 40 is composed of Ni. The anode electrode 40 is in Schottky-contact with the electron supply layer 18.

The cathode electrode 42 is arranged on the electron supply layer 18. The cathode electrode 42 is an electrode made of layers of Ti and Al arranged in a stack. Ti is in contact with the electron supply layer 18, and Al is layered on the Ti. The cathode electrode 42 is in ohmic contact with the electron supply layer 18. The cathode electrode 42 is separated from the anode electrode 40.

In the diode region 92, a Schottky Barrier Diode (hereinafter, referred to as SBD) is composed of the electron transit layer 16, electron supply layer 18, anode electrode 40, and cathode electrode 42. The interface (Schottky junction face) between the anode. electrode 40 and the electron supply layer 18 does not become a barrier to an electron flowing from the electron supply layer 18 to the anode electrode 40. Therefore, when the potential of the anode electrode 40 is higher than that of the cathode electrode 42, electrons flow from the cathode electrode 42 to the anode electrode 40 through the 2DEG of the hetero junction interface 18a, as shown by the arrow 82 in FIG. 1. That is, SBD turns on. Meanwhile, the interface (Schottky junction face) between the anode electrode 40 and the electron supply layer 18 becomes a barrier to an electron flowing from the anode electrode 40 to the electron supply layer 18. Therefore, when the potential of the cathode electrode 42 is higher than that of the anode electrode 40, electrons cannot pass through the Schottky junction face, so that almost no current flows between the cathode electrode 42 and the anode electrode 40. That is, SBD does not turn on.

In the temperature sensor region 94, a p-type resistance layer 50, a first sense electrode 51, and a second sense electrode 52 are provided.

The p-type resistance layer 50 is arranged on the electron supply layer 18. The p-type resistance layer 50 is in contact with the electron supply layer 18. The p-type resistance layer 50 is composed of InAlGaN of p-type. To be more specific, the p-type resistance layer 50 is composed of $In_{x2}Al_{y2}Ga_{1-x2-y2}N$ of p-type ($0 \leq x2 \leq 1$, $0 \leq y2 \leq 1$, $0 \leq 1-xp2-y2 \leq 1$). That is, the p-type resistance layer 50 has the same composition as the p-type gate layer 34. Additionally, the thickness of the p-type resistance layer 50 is equal to that of the p-type gate layer 34. The p-type resistance layer 50 is arranged in the temperature sensor region 94, which is outside the HEMT region 90. Therefore, in a plan view of the surface 11a of the semiconductor substrate 11 (that is, the surface of the electron supply layer 18), the p-type resistance layer 50 is disposed outside the region between the source electrode 30 and the drain electrode 32.

The first sense electrode 51 is arranged on the p-type resistance layer 50. The first sense electrode Si is composed of Ni. The first sense electrode 51 is in ohmic contact with the p-type resistance layer 50.

The second sense electrode 52 is arranged on the p-type resistance layer 50. The second sense electrode 52 is composed of Ni. The second sense electrode 52 is in ohmic contact with the p-type resistance layer 50. The second sense electrode 52 is separated from the first sense electrode 51.

Figure 2:
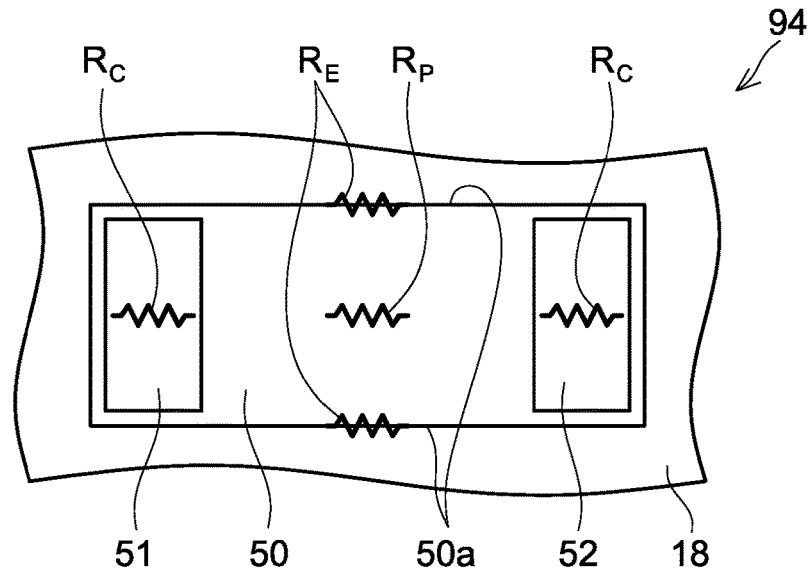
FIG. 2 is a plan view of a temperature sensor region 94 as seen from above.

FIG. 2 is a plan view showing the temperature sensor region 94 as seen from above. The p-type resistance layer 50 has an approximately rectangular flat shape. The first sense electrode 51 and the second sense electrode 52 are provided on the surface of the p-type resistance layer 50 and situated near either end of the p-type layer 50, respectively, in a longitudinal direction thereof.

When a constant voltage is applied between the first and second sense electrodes 51, 52, a current flows via the p-type resistance layer 50. Since the electrical resistance of the p-type resistance layer 50 changes with temperature, a current flowing between the first and second sense electrodes 51, 52 also changes with temperature. Therefore, by detecting a current flowing between the first and second sense electrodes 51, 52, a temperature can be detected. That is, in the temperature sensor region 94, a temperature sensor is composed of the p-type resistance layer 50, first sense electrode 51, and second sense electrode 52. Incidentally, a temperature may be detected by detecting a voltage between the first and second sense electrodes 51, 52 while causing a current to flow constantly between the first and second sense electrodes 51, 52.

As described above, in this semiconductor device 10, the HEMT and the temperature sensor are provided in the common semiconductor substrate 11. Because of this, the temperature sensor is arranged near the HEMT. Accordingly, the temperature of the HEMT can be detected more accurately by the temperature sensor. In particular, in this semiconductor device 10, the p-type resistance layer 50 of the temperature sensor is composed of the same InAlGaN of p-type as the p-type gate layer 34 of the HEMT. By virtue of this, the semiconductor device 10 can be manufactured as below. First, a buffer layer 14, an electron transit layer 16, and an electron supply layer 18 are sequentially grown on a ground substrate 12. Next, an InAlGaN layer of p-type (to be more specific, $In_{x2}Al_{y2}Ga_{1-x2-y2}N$ of p-type ($0 \leq x2 \leq 1$, $0 \leq y2 \leq 1$, $0 \leq 1-x2-y2 \leq 1$) is epitaxially-grown over the entire surface of the electron supply layer 18. Next, the InAlGaN layer is etched using photolithography, thereby separating the InAlGaN layer into a p-type gate layer 34 and a p-type resistance layer 50. Thereafter, trenches 60, a separating insulation layer 62, a source electrode 30, a drain electrode 32, a gate electrode 36, an anode electrode 40, a cathode electrode 42, a first sense electrode 51, and a second sense electrode are formed, thereby completing the semiconductor device 10. Photolithography makes it possible to form the p-type gate layer 34 and the p-type resistance layer 50 with extremely high accuracy. Therefore, the p-type resistance layer 50 can be arranged near the p-type gate layer 34. That is, the temperature sensor can be arranged near the HEMT. By virtue of this, in this semiconductor device 10, the temperature of the HEMT can be detected with high accuracy by the temperature sensor. In addition, arranging the temperature sensor near the HEMT in this manner enables a reduction in size of the semiconductor device 10. In addition, arranging the temperature sensor near the HEMT shortens wiring between the HEMT and the temperature sensor, thus reducing the parasitic resistance, parasitic capacitance, and parasitic inductance of wiring. Therefore, the response speed of the HEMT can be improved. In addition, if an HEMT and a temperature sensor are formed on separate semiconductor substrates as in JP 2014-99535 A, the HEMT and the temperature sensor have to be manufactured separately. In contrast to this, in the semiconductor device 10 according to the present embodiment, the p-type gate layer 34 and the p-type resistance layer 50 can be manufactured in a common process. Moreover, the first sense electrode 51 and the second sense electrode 52 can be manufactured in a process common to the gate electrode 36. Therefore, compared to a conventional one, a semiconductor device having a HEMT and a temperature sensor can be manufactured more efficiently. In addition, the resistance of the p-type resistance layer 50 (i.e. InAlGaN of p-type) depends greatly on temperature. Therefore, a temperature can be detected with high accuracy by the temperature sensor that uses the p-type resistance layer 50. Especially, by forming the p-type resistance layer 50 by means of epitaxial growth, the crystallinity, the concentration of p-type impurities, and the thickness of the p-type resistance layer 50 can be controlled with extremely high accuracy. By virtue of this, the characteristics of the temperature sensor can be controlled with high accuracy. Accordingly, this temperature sensor is able to detect temperature with higher accuracy.

Figure 3:
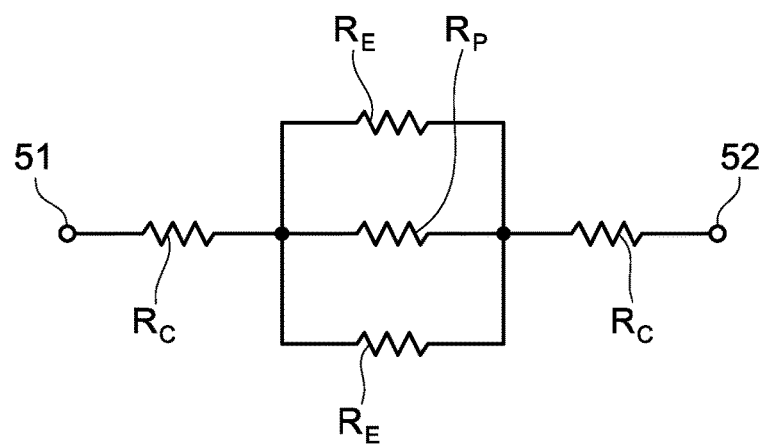
FIG. 3 is an equivalent circuit view of the temperature sensor region 94.

Each of resistances $R_C$, $R_P$, and $R_E$ in FIG. 2 represents an electrical resistance of the temperature sensor. The resistances $R_C$ represent the respective contact resistances of the first sense electrode 51 and second sense electrode 52 with respect to the p-type resistance layer 50. The resistance $R_P$ represents the resistance of the p-type resistance layer 50 (i.e., a resistance with respect to a current flowing in the p-type resistance layer 50). In addition, some of the current flowing between the first sense electrode 51 and the second sense electrode 52 flows along the processed edges 50a of the p-type resistance layer 50 (i.e., sides of the p-type resistance layer 50). Resistances $R_E$ represent resistances with respect to currents flowing along the processed edges 50a. The electrical resistance between the first and second sense electrodes 51, 52 can be represented as shown in FIG. 3, by using resistances $R_C$, $R_P$ and $R_E$. Among the resistances $R_C$, $R_P$, and $R_E$, the resistance value of the resistance $R_P$ changes most significantly with temperature. Accordingly, in order to improve sensitivity of the temperature sensor, influence of the resistances $R_C$ and resistances $R_E$ has to be minimized. Now, descriptions will be given of the respective configurations of Embodiments 2 and 3 that are better able to improve the sensitivity of the temperature sensor on the basis of such a point.

Embodiment 2

Figure 4:
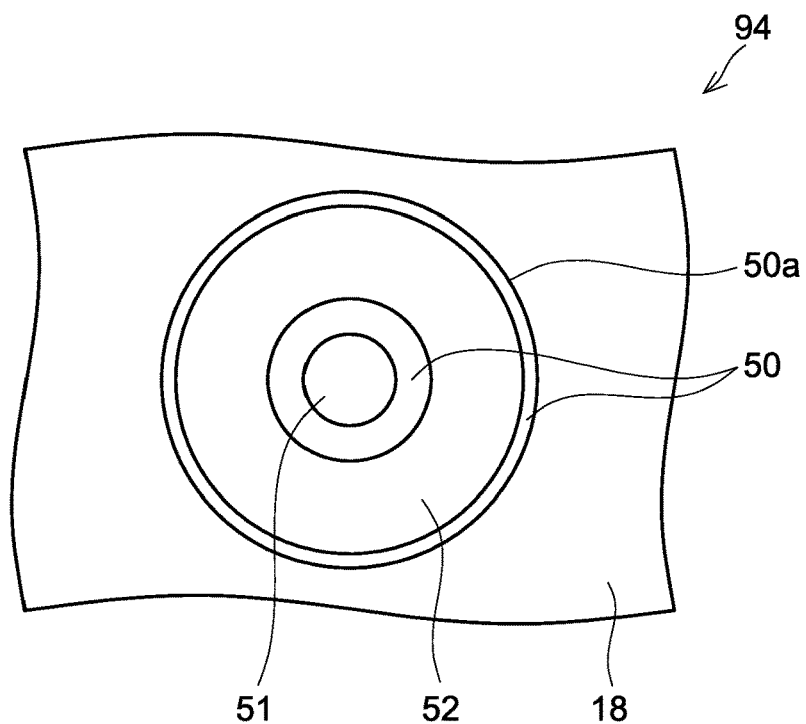
FIG. 4 is a plan view of the temperature region 94 according to an embodiment 2, as seen from above.

As shown in FIG. 4, in a semiconductor device according to an embodiment 2, a second sense electrode 52 has an annular shape extending such that the second sense electrode 52 surrounds a first sense electrode 52 in a plan view of a temperature sensor region 94 as seen from above. Accordingly, in the embodiment 2, a current flowing between the first and second sense electrodes 51, 52 does not pass though the processed edge 50a of a p-type resistance layer 50. That is, in the semiconductor device in the embodiment 2, the resistances $R_E$ in FIG. 3 is not present. By virtue of this, a sensitivity of the temperature sensor is high in the semiconductor device in the embodiment 2.

Embodiment 3

Figure 5:
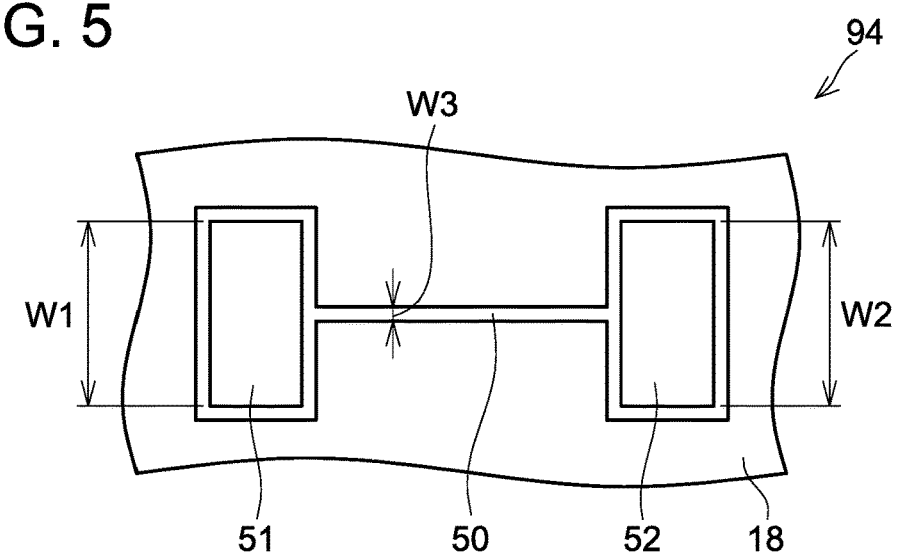
FIG. 5 is a plan view of the temperature region 94 according to an embodiment 3, as seen from above.

In a semiconductor device according to an embodiment 3, a width W3 of a p-type resistance layer 50, which is located between a first sense electrode 51 and a second sense electrode 52, is narrow as shown in FIG. 5. Specifically, the width W3 of the p-type resistance layer 50 is narrower than the width W1 of the first sense electrode 51 and the width W2 of the second sense electrode 52. The widths W1, W2, and W3 are dimensions in a direction orthogonal to a direction from the center of the first sense electrode 51 to the center of the second sense electrode 52 in a plan view of a temperature sensor region 94 as seen from above, as shown in FIG. 5. As just described, since the width W3 of the p-type resistance layer 50 is narrow, a resistance of the p-type resistance layer 50 is high. That is, in the semiconductor device according to the embodiment 3, the resistance value of the resistance $R_P$ in FIG. 3 is high and, therefore, the influence of the resistances $R_C$ is relatively small. Accordingly, in the semiconductor device according to the embodiment 3, the sensitivity of the temperature sensor is high.

The first sense electrode 51 and second sense electrode 52 in each of the foregoing embodiments 1 to 3 are composed of Ni. However, the first and second sense electrodes 51, 52 may he composed of Pd, Ag, Pt, or the like. These materials can also be in ohmic contact with the p-type resistance layer 50.

Embodiment 4

Figure 6:
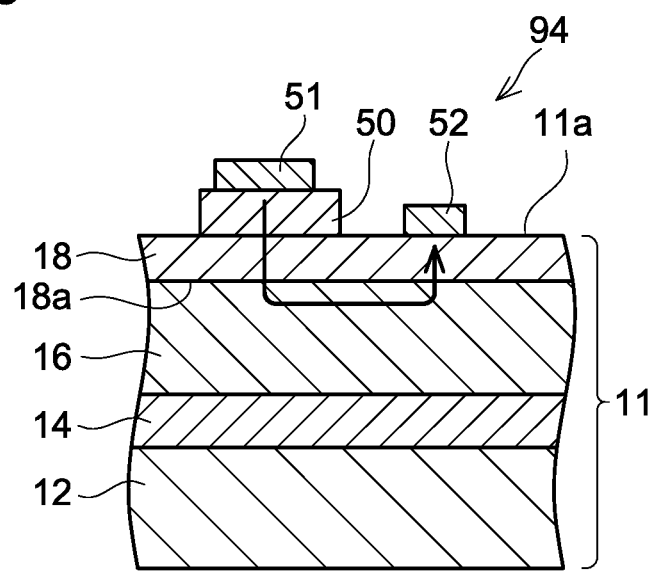
FIG. 6 is a vertical sectional view of the temperature sensor region 94 according to an embodiment 4.

In the embodiments 1 to 3, both of the first sense electrode 51 and second sense electrode 52 are arranged on the p-type resistance layer 50. By contrast, in a semiconductor device according to an embodiment 4, a second sense electrode 52 is arranged on the electron supply layer 18 as shown in FIG. 6. That is, the second sense electrode 52 is in direct contact with the electron supply layer 18. The second sense electrode 52 is in ohmic contact with the electron supply layer 18. A first sense electrode 51 is arranged on a p-type resistance layer 50.

In the semiconductor device according to the embodiment 4, a temperature sensor is composed of the first sense electrode 51, the second sense electrode 52, the p-type resistance layer 50, the electron supply layer 18, and an electron transit layer 16. By making a potential of the first sense electrode 51 higher than that of the second sense electrode 52, a current flows as shown by an arrow in FIG. 6. That is, a current flows from the first sense electrode 51 to the second sense electrode 52 through the p-type resistance layer 50 and the 2DEG of the hetero junction interface 18a. Also in the configuration of the embodiment 4, since a current flows from the first sense electrode 51 to the second sense electrode 52 via the p-type resistance layer 50, this current changes with the resistance (i.e., temperature) of the p-type resistance layer 50. Hence, also in the semiconductor device according to the embodiment 4, a temperature can be detected by the temperature sensor. In addition, contact resistance with respect to the electron supply layer 18 (i.e., InAlGaN of i-type) for the second sense electrode 52 can be reduced easily. By virtue of this, the contact area of the second sense electrode 52 can be reduced. Therefore, according to the configuration of the embodiment 4, a temperature sensor region 94 can be made smaller.

In the foregoing embodiments 1 to 4, the first sense electrode 51 is in contact with the p-type resistance layer 50, whereas the second sense electrode 52 is in contact with the p-type resistance layer 50 or the electron supply layer 18. However, the first and second sense electrodes 51, 52 may be arranged in any other way as long as a current can he caused to flow into the p-type resistance layer 50. For example, the first sense electrode 51 may be connected to the p-type resistance layer 50 via another layer.

In addition, in the foregoing embodiments 1 to 4, the gate electrode 36 is in direct contact with the p-type gate layer 34. However, another layer (e.g., a layer of n-type, an insulation layer, or the like) may be arranged between the gate electrode 36 and the p-type gate layer 34. As long as the potential of the p-type gate layer 34 can be controlled by the gate electrode 36, the gate electrode 36 may have any configuration.

In the foregoing embodiments 1 to 4, the source electrode 30 and the drain electrode 32 are in direct contact with the electron supply layer 18. However, the source electrode 30 and the drain electrode 32 may be connected to the electron supply layer 18 via another layer. As long as a current can flow between the source electrode 30 and the electron supply layer 18, the source electrode 30 may have any configuration. As long as a current can flow between the drain electrode 32 and the electron supply layer 18, the drain electrode 32 may also have any configuration.

In the foregoing embodiments 1 to 4, the diode region 92 is provided between the HEMT region 90 and the temperature sensor region 94. However, the temperature sensor region 94 may be provided adjacent to the HEMT region 90.

In addition, in the foregoing embodiments 1 to 4, the anode electrode 40 is composed of Ni. However, the anode electrode 40 may be composed of another material such as Pt, Pd, Mo, W, TiN, WSi, or the like.

In addition, in the foregoing embodiments 1 to 4, the HEMT region 90, the diode region 92, and the temperature sensor region 94 are separated by the respective separating insulation layers 62 in the trenches 60. However, the regions may be separated by regions formed by injecting ions of N, Al, C, B, Zn, F, or the like.

Some of the technical elements disclosed herein are listed below. Technical elements below are independently useful.

A semiconductor device disclosed herein as an example may further comprise a HEMT. The temperature sensor and the HEMT may be provided in a common semiconductor substrate. The HEMT may comprise: a second nitride semiconductor layer, a third nitride semiconductor layer located on the second nitride semiconductor layer and having a bandgap wider than a bandgap of the second nitride semiconductor layer, a source electrode electrically connected to the third nitride semiconductor layer, a drain electrode electrically connected to the third nitride semiconductor layer, a fourth nitride semiconductor layer of the p-type located on the third nitride semiconductor layer and located in a range between the source electrode and the drain electrode in a plan view of an upper surface of the third semiconductor layer, and a gate electrode located above the fourth nitride semiconductor layer. The first nitride semiconductor layer may be located on the third nitride semiconductor layer and located outside the range in a plan view of the upper surface of the third semiconductor layer.

According to this configuration, since the HEMT and the temperature sensor are provided in one semiconductor substrate, the temperature sensor can be arranged close to the HEMT. Therefore, the temperature of the HEMT can be detected accurately by the temperature sensor.

In a semiconductor device disclosed herein as an example, the first sense electrode and the second sense electrode may be located on the first nitride semiconductor layer.

In a semiconductor device disclosed herein as an example, the second sense electrode may extend on the first nitride semiconductor layer in an annular shape surrounding the first sense electrode.

According to this configuration, the influence of the resistance of the processed edge of the first nitride semiconductor layer can be minimized. Therefore, temperature can be detected with higher accuracy by the temperature sensor.

In a case where the first and the second sense electrodes are located on the first nitride semiconductor layer, a width of at least a part of the first nitride semiconductor Layer positioned between the first sense electrode and the second sense electrode may be narrower than a width of the first sense electrode and is narrower than a width of the second sense electrode. The foregoing "width" refers to a dimension in a direction orthogonal to a direction from the center of the first sense electrode to the center of the second sense electrode in a plan view of the surface of the first nitride semiconductor layer.

According to this configuration, the influence of the contact resistance on the first nitride semiconductor layer of the first and second electrodes can be inhibited. Accordingly, the temperature of the HEMT can be detected with higher accuracy by the temperature sensor.

In a semiconductor device disclosed herein as an example, the first sense electrode may be located on the first nitride semiconductor layer, and the second sense electrode may be located on the third nitride semiconductor layer.

In a semiconductor device disclosed herein as an example, a composition of the first nitride semiconductor layer may be same as a composition of the fourth nitride semiconductor layer.

A semiconductor device disclosed herein as an example may further comprise a Schottky barrier diode. The Schottky barrier diode may comprise: an anode electrode being in Schottky contact with the third nitride semiconductor layer, and a cathode electrode being in ohmic contact with the third nitride semiconductor layer.

According to this configuration, a semiconductor device further including a Schottky barrier diode can be obtained. Even in a case where a temperature rise is likely to occur as a result of providing the HEMT and the Schottky barrier diode into one chip, a temperature can be detected with high accuracy by the temperature sensor.

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

The invention claimed is:

1. A semiconductor device comprising a temperature sensor, wherein the temperature sensor comprises:
   a first nitride semiconductor layer of a p-type;
   a first sense electrode and a second sense electrode located to be capable of passing an electric current between the first sense electrode and the second sense electrode through the first nitride semiconductor layer; and
   a High Electron Mobility Transistor, wherein the temperature sensor and the High Electron Mobility Transistor are provided in a common semiconductor substrate, wherein the High Electron Mobility Transistor comprises:
      a second nitride semiconductor layer;
      a third nitride semiconductor layer located on the second nitride semiconductor layer and having a bandgap wider than a bandgap of the second nitride semiconductor layer;
      a source electrode electrically connected to the third nitride semiconductor layer;
      a drain electrode electrically connected to the third nitride semiconductor layer;
      a p-type located on the third nitride semiconductor layer and located in a range between the source electrode and the drain electrode in a plan view of an upper surface of the third semiconductor layer; and
      a gate electrode located above the fourth nitride semiconductor layer,
   wherein an electrical resistance of the first nitride semiconductor layer changes with temperature,
   wherein the temperature sensor senses the temperature based on the electrical resistance of the first nitride semiconductor layer, and
   wherein the first nitride semiconductor layer is located on the third nitride semiconductor layer and is also located outside the range in the plan view of the upper surface of the third semiconductor layer.

2. The semiconductor device of claim 1, wherein
   the first sense electrode is located on the first nitride semiconductor layer, and
   the second sense electrode is located on the third nitride semiconductor layer.

3. The semiconductor device of claim 1, wherein a composition of the first nitride semiconductor layer is the same as a composition of the fourth nitride semiconductor layer.

4. The semiconductor device of claim 1, further comprising a Schottky barrier diode, wherein the Schottky barrier diode comprises:
   an anode electrode being in Schottky contact with the third nitride semiconductor layer; and
   a cathode electrode being in ohmic contact with the third nitride semiconductor layer.

5. A semiconductor device comprising a temperature sensor, wherein the temperature sensor comprises:
   a first nitride semiconductor layer of a p-type; and
   a first sense electrode and a second sense electrode located to be capable of passing an electric current between the first sense electrode and the second sense electrode through the first nitride semiconductor layer,
   wherein an electrical resistance of the first nitride semiconductor layer changes with temperature,
   wherein the temperature sensor senses the temperature based on the electrical resistance of the first nitride semiconductor layer, and
   wherein the first sense electrode and the second sense electrode are located on the first nitride semiconductor layer.

6. The semiconductor device of claim 5, wherein the second sense electrode extends on the first nitride semiconductor layer in an annular shape surrounding the first sense electrode.

7. The semiconductor device of claim 5, wherein a width of at least a part of the first nitride semiconductor layer positioned between the first sense electrode and the second sense electrode is narrower than a width of the first sense electrode and is narrower than a width of the second sense electrode.

8. A semiconductor device comprising a temperature sensor, wherein the temperature sensor comprises:
   a first nitride semiconductor layer of a p-type;
   a first sense electrode and a second sense electrode located to be capable of passing an electric current between the first sense electrode and the second sense electrode through the first nitride semiconductor layer; and
   an i-type nitride semiconductor layer,
   wherein an electrical resistance of the first nitride semiconductor layer changes with temperature,
   wherein the temperature sensor senses the temperature based on the electrical resistance of the first nitride semiconductor layer,
   wherein the first nitride semiconductor layer is located on the i-type nitride semiconductor layer,
   wherein the first sense electrode is located on the first nitride semiconductor layer, and
   wherein the second sense electrode is located on the first nitride semiconductor layer and separated from the first sense electrode.

9. A method of manufacturing a semiconductor device, the semiconductor device comprising a High Electron Mobility Transistor and a temperature sensor provided in a common semiconductor substrate, the method comprising:
   growing a third nitride semiconductor layer on a second nitride semiconductor layer, the third nitride semiconductor layer having a bandgap wider than a bandgap of the second nitride semiconductor layer;
   growing a p-type nitride semiconductor layer on the third nitride semiconductor layer;
   etching a part of the p-type nitride semiconductor layer so as to divide the p-type nitride semiconductor layer into a fourth nitride semiconductor layer and a first nitride semiconductor layer;
   forming a gate electrode above the fourth nitride semiconductor layer;
   forming a source electrode and a drain electrode, which are electrically connected to the third nitride semiconductor layer, so that the fourth nitride semiconductor layer is located in a range between the source electrode and the drain electrode and the first nitride semiconductor layer is located outside the range in a plan view of an upper surface of the third nitride semiconductor layer; and
   forming a first sense electrode and a second sense electrode so as to be capable of passing an electric current between the first sense electrode and the second sense electrode through the first nitride semiconductor layer.

* * * * *